US010566953B1

(12) United States Patent
Wu et al.

(10) Patent No.: US 10,566,953 B1
(45) Date of Patent: Feb. 18, 2020

(54) ELECTRONIC IMPEDANCE TUNER

(71) Applicant: Ningbo University, Zhejiang (CN)

(72) Inventors: Ke Wu, Saint-Laurent (CA); Yangping Zhao, Guangdong (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 16/504,313

(22) Filed: Jul. 7, 2019

(30) Foreign Application Priority Data

Aug. 14, 2018 (CN) .......................... 2018 1 0920114

(51) Int. Cl.
*H03H 11/28* (2006.01)
(52) U.S. Cl.
CPC .................... *H03H 11/28* (2013.01)
(58) Field of Classification Search
CPC ........ H03H 11/28; H03H 11/30; H01L 29/868
See application file for complete search history.

(56) References Cited

U.S. PATENT DOCUMENTS

| | | | | |
|---|---|---|---|---|
| 5,034,708 A | * | 7/1991 | Adamian | H01P 5/04 324/637 |
| 5,276,411 A | | 1/1994 | Woodin, Jr. et al. | |
| 9,660,607 B2 | * | 5/2017 | Boudiaf | H03H 7/38 |
| 2010/0253445 A1 | * | 10/2010 | Ando | H01P 1/15 333/101 |
| 2012/0119971 A1 | * | 5/2012 | Bae | H04B 1/0458 343/860 |

* cited by examiner

*Primary Examiner* — Patrick C Chen
(74) *Attorney, Agent, or Firm* — JCIPRNET

(57) ABSTRACT

An electronic impedance tuner comprises an adjusting circuit, N cell tuning circuits identical in structure and a switch controller. The adjusting circuit comprises a first microstrip line, a second microstrip line, a first capacitor, a second capacitor, a third capacitor, a first inductor, a second inductor and a first PIN diode. Each cell tuning circuit comprises a third microstrip line, a fourth microstrip line, a fourth capacitor, a fifth capacitor, a second PIN diode and a third capacitor. The capacitance $C_d$ of the fourth capacitor meets the condition:

$$\frac{4Y_s}{N\pi f_2} \frac{|\Gamma_{req}|}{\sqrt{1-|\Gamma_{req}|^2}} \leq C_d \leq \frac{Y_s}{\pi f_1} \frac{|\Gamma_{req}|}{\sqrt{1-|\Gamma_{req}|^2}}.$$

The length d of the third microstrip line meets the condition:

$$\lambda_1/4(N+1) < d < \frac{c}{4\sqrt{\varepsilon_{\mathit{reff}}}}\left[\sqrt{(C_d\cdot Z_0)^2 + \left(\frac{2}{\pi f_{\mathit{Bragg}}}\right)^2} - C_d\cdot Z_0\right].$$

The electronic impedance tuner has the advantages of being small in size and low in cost while having a high coverage rate in the Smith chart.

2 Claims, 5 Drawing Sheets

ELECTRONIC IMPEDANCE TUNER

CROSS-REFERENCE TO RELATED APPLICATION

This application claims priority to and the benefit of China Patent Application No. CN201810920114.6, filed on Aug. 14, 2018, the disclosures of which are incorporated herein by reference in its entirety.

TECHNICAL FIELD

The invention relates to an impedance tuner, in particular to an electronic impedance tuner.

DESCRIPTION OF RELATED ART

The continuous increase of the sales volume in wireless communication equipment has posed a new challenge to the production and test capacity of power amplifier manufacturers or radio module manufacturers. In the wireless communication equipment, an antenna at the rear terminal of a power amplifier has a very limited area and is very sensitive to touches by humans as well as the ambient environment, and for this reason, the power amplifier should be tested on site before delivery under different impedances so as to simulate mismatches of the antenna under different conditions. Electronic impedance tuners are used for generating different impedances and are of great importance for performance testing of the power amplifier.

U.S. Pat. No. 5,034,708A discloses a non-uniform distribution electronic impedance tuner which is designed in such a manner that only one PIN switch diode is partially turned on at any time and the loaded capacitance is controlled by an accurate current control system, and in this case, the PIN switch diode is used as a variable resistor, and has a large series resistance, resulting in a large loss of the electronic impedance tuner.

U.S. Pat. No. 5,276,411A discloses two electronic impedance tuner arrays and a combiner network. Compared with the non-uniform distribution electronic impedance tuner disclosed by U.S. Pat. No. 5,034,708A, the electronic impedance tuner arrays in this patent have a small loss. However, the electronic impedance tuner arrays in this patent can generate only $N^2$ impedance states instead of $2^N$ impedance states through 2*N PIN switch diodes thus, causing waste of resources and spaces; and as multiple arrays and multiple combiners are adopted by the two electronic impedance tuner arrays, the number of the PIN switch diode increases, and consequentially, the circuit cost increases, the overall circuit size becomes large, and then on-chip testing is limited. In these two United States Patents, in order to avoid the situation that the same impedance state is generated in different states, the distances between the tuning cells follow the prime relation, however, the optimal coverage rate in the Smith chart cannot be ensured.

BRIEF SUMMARY OF THE INVENTION

The technical issue to be settled by the invention is to provide an electronic impedance tuner which is small in size and low in cost and has a high coverage rate.

The technical solution adopted by the invention to settle the above technical issue is as follows: An electronic impedance tuner comprises an adjusting circuit, N cell tuning circuits identical in structure and a switch controller, wherein N is an integer greater than or equal to 2; the adjusting circuit has an input terminal, an output terminal and a control terminal; each cell tuning circuit has an input terminal, an output terminal and a control terminal; the switch controller has N+1 output terminals and is used for controlling on/off of the adjusting circuit and the N cell tuning circuits; the output terminal of the adjusting circuit is connected to the input terminal of the first cell tuning circuit, and the output terminal of the $j^{th}$ cell tuning circuit is connected to the input terminal of the $(j+1)^{th}$ cell tuning circuit, wherein j=1, 2, . . . , and N−1, and the N+1 output terminals of the switch controller are connected to the control terminal of the adjusting circuit and the control terminals of the N cell tuning circuits in a one-to-one correspondence manner. The adjusting circuit comprises a first microstrip line, a second microstrip line, a first capacitor, a second capacitor, a third capacitor, a first inductor, a second inductor and a first PIN diode, wherein one terminal of the first microstrip line is the input terminal of the adjusting circuit; the other terminal of the first microstrip line is connected to one terminal of the first capacitor and one terminal of the second capacitor; the other terminal of the first capacitor is connected to a negative electrode of the first PIN diode and one terminal of the second microstrip line; the other terminal of the second microstrip line is the output terminal of the adjusting circuit; the other terminal of the second capacitor is connected to one terminal of the first inductor and a positive electrode of the first PIN diode; the other terminal of the first inductor is connected to one terminal of the third capacitor, and a corresponding connecting terminal is the control terminal of the adjusting circuit; the other terminal of the third capacitor is grounded; and the second microstrip line is grounded via the second inductor. Each cell tuning circuit comprises a third microstrip line, a fourth microstrip line, a fourth capacitor, a fifth capacitor, a second PIN diode and a third inductor, wherein one terminal of the third microstrip line is the input terminal of the cell tuning circuit; the other terminal of the third microstrip line is connected to one terminal of the fourth capacitor and one terminal of the fourth microstrip line; the other terminal of the fourth microstrip line is the output terminal of the cell tuning circuit; the other terminal of the fourth capacitor is connected to a positive electrode of the second PIN diode and one terminal of the third inductor; a negative electrode of the second PIN diode is grounded; the other terminal of the third inductor is connected to one terminal of the fifth capacitor, and a corresponding terminal is the control terminal of the cell tuning circuit; the other terminal of the fifth capacitor is grounded; the capacitance of the fourth capacitor is marked as $C_d$ and meets the condition:

$$\frac{4Y_s}{N\pi f_2}\frac{|\Gamma_{req}|}{\sqrt{1-|\Gamma_{req}|^2}} \le C_d \le \frac{Y_s}{\pi f_1}\frac{|\Gamma_{req}|}{\sqrt{1-|\Gamma_{req}|^2}},$$

wherein $Y_s$ is a source admittance, $f_1$ is a lower limit of a design operating frequency range, $f_2$ is an upper limit of the design operating frequency range, $\Gamma_{req}$ is a maximum design reflection coefficient, || is an absolute value symbol, and π is the symbol of Pi; the length of the third microstrip line is equal to that of the fourth microstrip line, the impedance of the third microstrip line is equal to that of the fourth microstrip line, and the length of the third microstrip line is marked as d and meets the condition:

$$\lambda_1/4(N+1) < d < \frac{c}{4\sqrt{\varepsilon_{\text{reff}}}}\left[\sqrt{(C_d \cdot Z_0)^2 + \left(\frac{2}{\pi f_{\text{Bragg}}}\right)^2} - C_d \cdot Z_0\right],$$

wherein c refers to the light speed and has a value of $2.998\times10^8$ m/s, $f_{\text{Bragg}}$ refers to the Bragg cut-off frequency and has a value ranging from 1.2 $f_2$ to 1.7 $f_2$, $\varepsilon_{\text{reff}}$ is an effective dielectric constant of the third microstrip line, $Z_0$ is the impedance of the third microstrip line and has a value ranging from 70Ω to 110Ω, $\lambda_1$ is a wavelength corresponding to the lower limit $f_1$ of the design operating frequency range, and the impedance of the first microstrip line and the impedance of the second microstrip line are both 50Ω.

The inductance of the first inductor is marked as $L_{bias1}$, the inductance of the second inductor is marked as $L_{bias2}$, and the inductance of the third inductor is marked as $L_{bias3}$, wherein $1000\Omega < 2\pi f_1 L_{bias1} < 3000\Omega$, $1000\Omega < 2\pi f_1 L_{bias2} < 3000\Omega$, and $1000\Omega < 2\pi f_1 L_{bias3} < 3000\Omega$; the capacitance of the first capacitor is marked as $C_{a1}$, wherein $200\Omega < 1/(2\pi f_1 C_{a1}) < 400\Omega$; the capacitance of the second capacitor is marked as $C_{a2}$, wherein $3\Omega < 1/(2\pi f_1 C_{a2}) < 10\Omega$; the capacitance of the third capacitor and the capacitance of the fifth capacitor are 0.01 pF; and $Y_s$ has a value of 0.02.

Compared with the prior art, the invention has the following advantages: The electronic impedance tuner is formed by the adjusting circuit, the N cell tuning circuits identical in structure and the switch controller. The adjusting circuit comprises the first microstrip line, the second microstrip line, the first capacitor, the second capacitor, the third capacitor, the first inductor, the second inductor and the first PIN diode, and each cell tuning circuit comprises the third microstrip line, the fourth microstrip line, the fourth capacitor, the fifth capacitor, the second PIN diode and the third inductor; the capacitance $C_d$ of the fourth capacitor meets the condition:

$$\frac{4Y_s}{N\pi f_2}\frac{|\Gamma_{req}|}{\sqrt{1-|\Gamma_{req}|^2}} \leq C_d \leq \frac{Y_s}{\pi f_1}\frac{|\Gamma_{req}|}{\sqrt{1-|\Gamma_{req}|^2}},$$

$Y_s$ is a source admittance, $f_1$ is a lower limit of a design operating frequency range, $f_2$ is an upper limit of the design operating frequency range, $\Gamma_{req}$ is a maximum design reflection coefficient, $\|$ is an absolute value symbol, and $\pi$ is the symbol of Pi; the length d of the third microstrip line meets the condition:

$$\lambda_1/4(N+1) < d < \frac{c}{4\sqrt{\varepsilon_{\text{reff}}}}\left[\sqrt{(C_d \cdot Z_0)^2 + \left(\frac{2}{\pi f_{\text{Bragg}}}\right)^2} - C_d \cdot Z_0\right],$$

wherein $f_{\text{Bragg}}$ refers to the Bragg cut-off frequency and has a value ranging from $1.2 f_2$ to $1.7 f_2$, $\varepsilon_{\text{reff}}$ is an effective dielectric constant of the third microstrip line, $Z_0$ is the impedance of the third microstrip line and has a value ranging from 70Ω to 110Ω, $\lambda_1$ is a wavelength corresponding to the lower limit $f_1$ of the design operating frequency range, and the impedance of the first microstrip line and the impedance of the second microstrip line are both 50Ω. In the invention, the adjusting circuit is kept as small as possible while increasing the coverage rate, and the states of the second PIN diodes in the N cell tuning units are controlled by the switch controller to generate different impedances, so that $2^{N+1}$ impedances can be generated through the adjusting circuit and an array formed by the N cell tuning circuits, and thus, the electronic impedance tuner is small in size and low in cost while having a high coverage rate in the Smith chart.

DETAILED DESCRIPTION OF THE INVENTION

The invention is further expounded below with reference to the accompanying drawings and embodiments.

Figure 1:
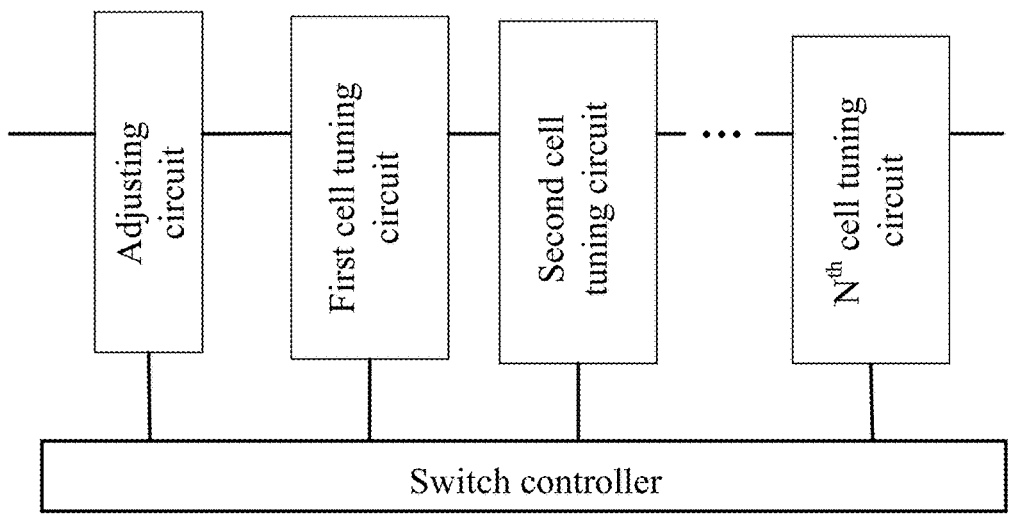
FIG. 1 is a structure diagram of an electronic impedance tuner of the invention.
Figure 2:
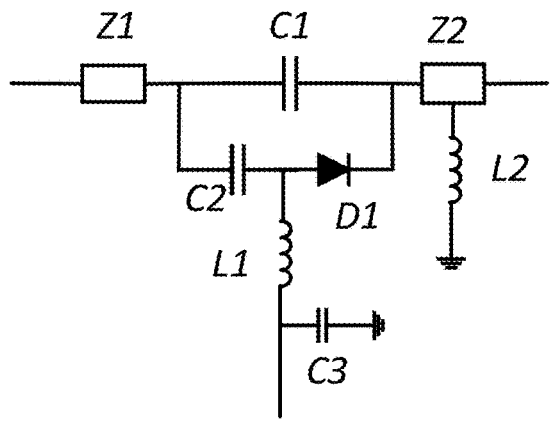
FIG. 2 is a circuit diagram of an adjusting circuit of the electronic impedance tuner of the invention.
Figure 3:
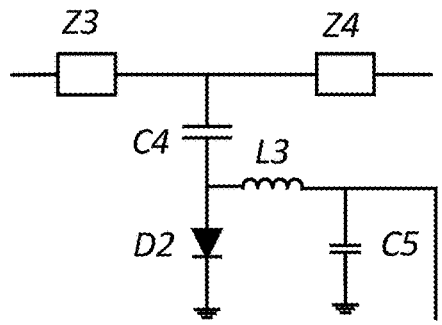
FIG. 3 is a circuit diagram of a cell tuning circuit of the electronic impedance tuner of the invention.

Embodiment 1: As shown in FIGS. 1-3, an electronic impedance tuner comprises an adjusting circuit, N cell tuning circuits identical in structure and a switch controller, wherein N is an integer greater than or equal to 2. The adjusting circuit has an input terminal, an output terminal and a control terminal. Each cell tuning circuit has an input terminal, an output terminal and a control terminal. The switch controller has N+1 output terminals and is used for controlling on/off of the adjusting circuit and the N cell tuning circuits. The output terminal of the adjusting circuit is connected to the input terminal of the first cell tuning circuit, and the output terminal of the $j^{th}$ cell tuning circuit is connected to the input terminal of the $(j+1)^{th}$ cell tuning circuit, wherein j=1, 2, . . . , and N−1. The N+1 output terminals of the switch controller are connected to the control terminal of the adjusting circuit and the control terminals of the N cell tuning circuits in a one-to-one correspondence manner. The adjusting circuit comprises a first microstrip line Z1, a second microstrip line Z2, a first capacitor C1, a second capacitor C2, a third capacitor C3, a first inductor L1, a second inductor L2 and a first PIN diode D1, wherein one terminal of the first microstrip line Z1 is the input terminal of the adjusting circuit; the other terminal of the first microstrip line Z1 is connected to one terminal of the first capacitor C1 and one terminal of the second capacitor C2; the other terminal of the first capacitor C1 is connected to a negative electrode of the first PIN diode D1 and one terminal of the second microstrip line Z2; the other terminal of the second microstrip line Z2 is the output terminal of the adjusting circuit; the other terminal of the second capacitor C2 is connected to one terminal of the first inductor L1 and a positive electrode of the first PIN diode D1; the other terminal of the first inductor L1 is connected to one terminal of the third capacitor C3, and a corresponding connecting terminal is the control terminal of the adjusting circuit; the other terminal of the third capacitor C3 is grounded; and the second microstrip line is grounded via the second inductor L2. Each cell tuning circuit comprises a third microstrip line Z3, a fourth microstrip line Z4, a fourth capacitor C4, a fifth capacitor C5, a second PIN diode D2 and a third inductor L3, wherein one terminal of the third microstrip line Z3 is the input terminal of the cell tuning circuit; the other terminal of the third microstrip line Z3 is connected to one terminal of the fourth capacitor C4 and one terminal of the fourth microstrip line Z4; the other terminal of the fourth microstrip line Z4 is the output terminal of the cell tuning circuit; the other terminal of the fourth capacitor C4 is connected to a positive electrode of the second PIN diode D2 and one terminal of the third inductor L3; a negative electrode of the second PIN diode D2 is grounded; the other terminal of the third inductor L3 is connected to one terminal of the fifth capacitor C5, and a corresponding terminal is the control terminal of the cell tuning circuit; the other terminal of the fifth capacitor C5 is grounded; the capacitance of the fourth capacitor C4 is marked as $C_d$ and meets the condition:

$$\frac{4Y_s}{N\pi f_2}\frac{|\Gamma_{req}|}{\sqrt{1-|\Gamma_{req}|^2}} \leq C_d \leq \frac{Y_s}{\pi f_1}\frac{|\Gamma_{req}|}{\sqrt{1-|\Gamma_{req}|^2}},$$

wherein $Y_s$ is a source admittance, $f_1$ is a lower limit of a design operating frequency range, $f_2$ is an upper limit of the design operating frequency range, $\Gamma_{req}$ is a maximum design reflection coefficient, || is an absolute value symbol, and π is the symbol of Pi; the length of the third microstrip line Z3 is equal to that of the fourth microstrip line Z4, the impedance of the third microstrip line Z3 is equal to that of the fourth microstrip line Z4, and the length of the third microstrip line Z3 is marked as d and meets the condition:

$$\lambda_1/4(N+1) < d < \frac{c}{4\sqrt{\varepsilon_{\mathit{reff}}}}\left[\sqrt{(C_d \cdot Z_0)^2 + \left(\frac{2}{\pi f_{Bragg}}\right)^2} - C_d \cdot Z_0\right],$$

wherein c refers to the light speed and has a value of $2.998\times10^8$ m/s, $f_{Bragg}$ refers to the Bragg cut-off frequency and has a value ranging from $1.2f_2$ to $1.7f_1$, $\varepsilon_{\mathit{reff}}$ is an effective dielectric constant of the third microstrip line Z3, $Z_0$ is the impedance of the third microstrip line Z3 and has a value ranging from 70Ω to 110Ω, $\lambda_1$ is a wavelength corresponding to the lower limit $f_1$ of the design operating frequency range, and the impedance of the first microstrip line Z1 and the impedance of the second microstrip line Z2 are both 50Ω.

In this embodiment, the switch controller is a mature product in the technical field.

Embodiment 2: This embodiment is basically the same as embodiment 1 and differs from embodiment 1 in the following aspects: in this embodiment, the inductance of the first inductor L1 is marked as $L_{bias1}$, the inductance of the second inductor L2 is marked as $L_{bias2}$, and the inductance of the third inductor L3 is marked as $L_{bias3}$, wherein 1000Ω<$2\pi f_1 L_{bias1}$<3000Ω, 1000Ω<$2\pi f_1 L_{bias2}$<3000Ω, and 1000Ω<$2\pi f_1 L_{bias3}$<3000Ω; the capacitance of the first capacitor C1 is marked as $C_{a1}$, wherein 200Ω<$1/(2\pi f_1 C_{a1})$<400Ω; the capacitance of the second capacitor C2 is marked as $C_{a2}$, wherein 3Ω<$1/(2\pi f_1 C_{a2})$<10Ω; the capacitance of the third capacitor C3 and the capacitance of the fifth capacitor C5 are 0.01 pF; and $Y_s$ has a value of 0.02.

Figure 4:
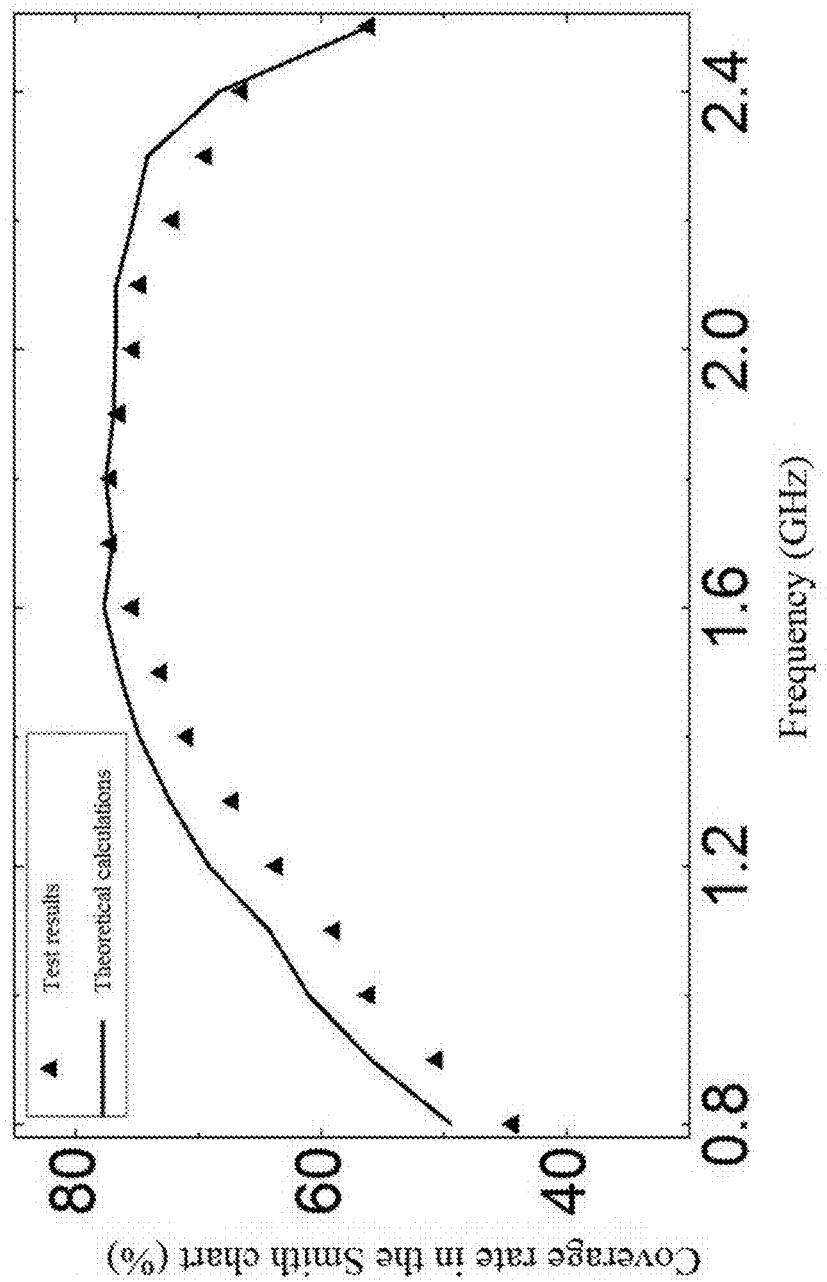
FIG. 4 is a comparison diagram of a test result and a theoretical calculation result of the coverage rate in the Smith chart of the electronic impedance tuner of the invention.
Figure 5A:
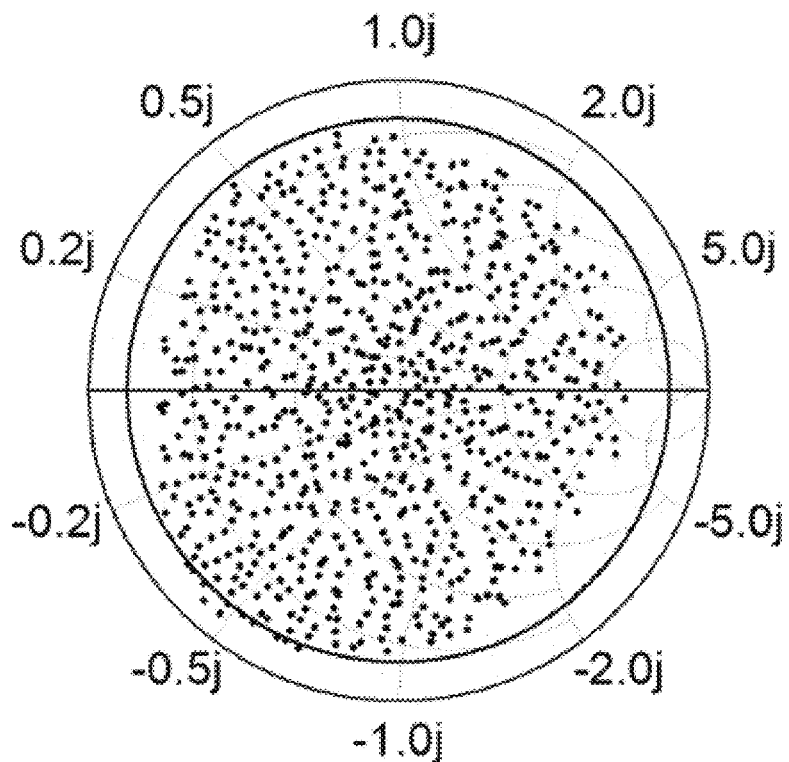
FIG. 5A is a diagram of actually-tested impedance distribution in the Smith chart of the electronic impedance tuner at a frequency of 1.2 GHz of the invention.
Figure 5B:
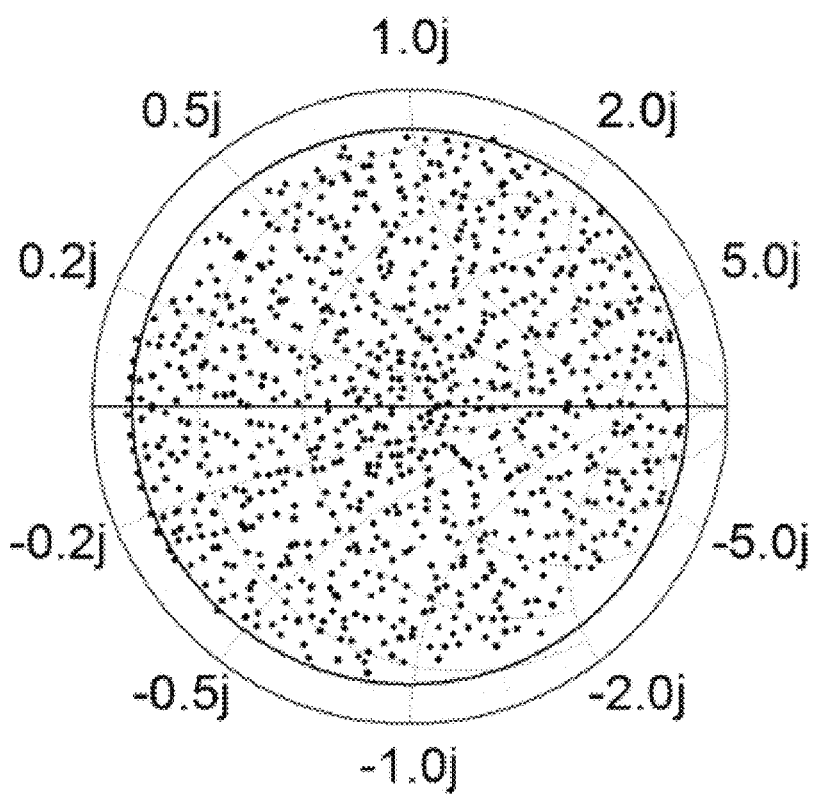
FIG. 5B is a diagram of actually-tested impedance distribution in the Smith chart of the electronic impedance tuner at a frequency of 1.5 GHz of the invention.
Figure 5C:
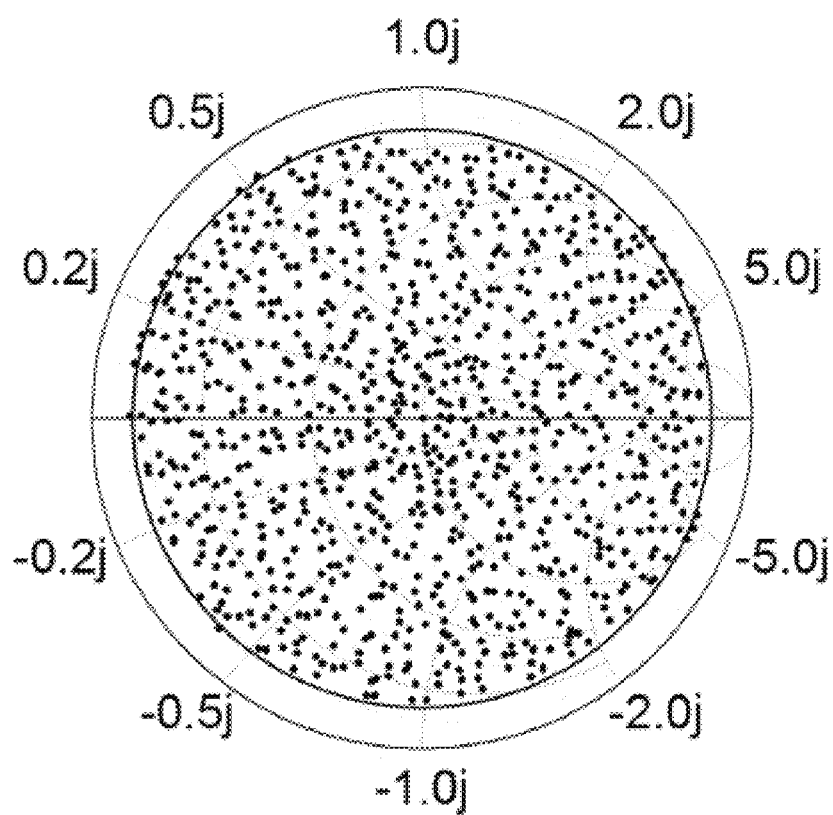
FIG. 5C is a diagram of actually-tested impedance distribution in the Smith chart of the electronic impedance tuner at a frequency of 1.8 GHz of the invention.
Figure 5D:
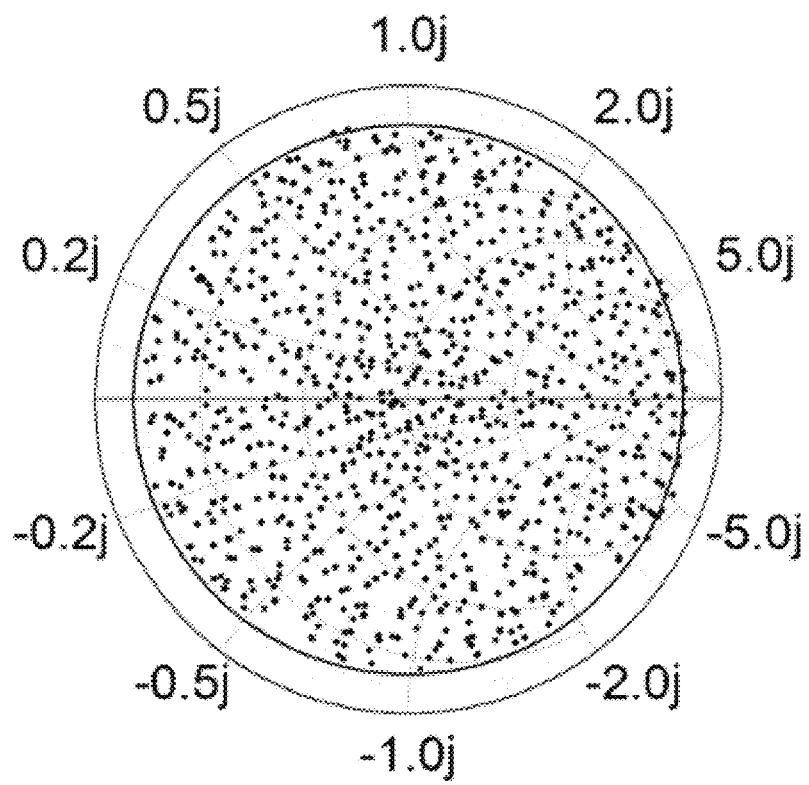
FIG. 5D is a diagram of actually-tested impedance distribution in the Smith chart of the electronic impedance tuner at a frequency of 2.1 GHz of the invention.
Figure 5E:
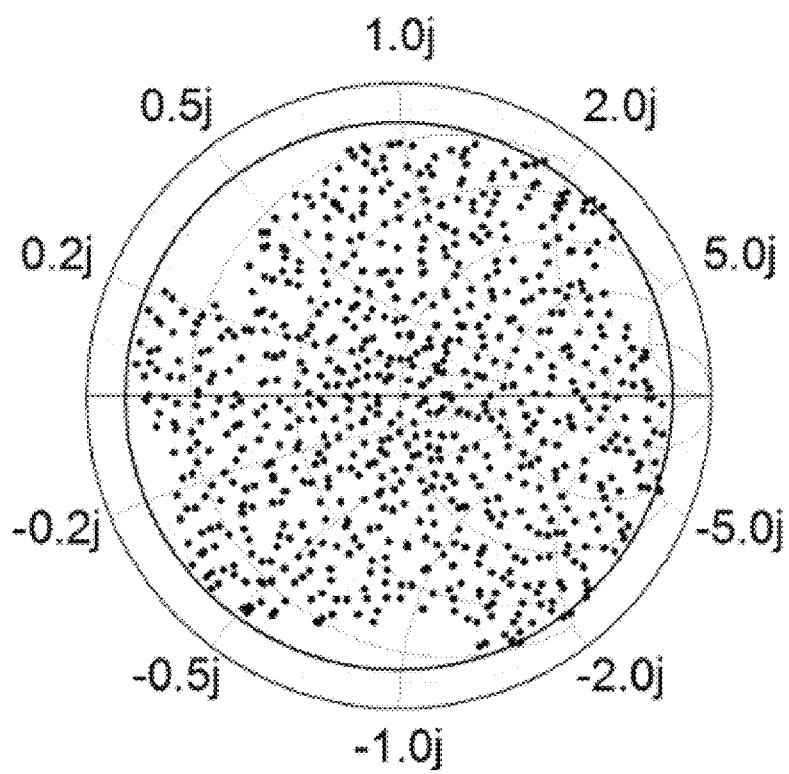
FIG. 5E is a diagram of actually-tested impedance distribution in the Smith chart of the electronic impedance tuner at a frequency of 2.4 GHz of the invention.

In order to verify the advantages of the electronic impedance tuner of the invention, the electronic impedance tuner including one adjusting circuit and an array formed by 13 cell tuning circuits is machined at an operating frequency of 0.8-2.5 GHz. Then, a test result of the coverage rate in the Smith chart of the electronic impedance tuner and a theoretical calculation result of the coverage rate in the Smith chart of the electronic impedance tuner are compared, wherein a comparison result is shown in FIG. 4, and it can be seen by analyzing FIG. 4 that an error between the test result and the theoretical calculation result is within 5%. FIG. 5A is a diagram of actually-tested impedance distribution in the Smith chart of the electronic impedance tuner at a frequency of 1.2 GHz of the invention, FIG. 5B is a diagram of actually-tested impedance distribution in the Smith chart of the electronic impedance tuner at a frequency of 1.5 GHz of the invention, FIG. 5C is a diagram of actually-tested impedance distribution in the Smith chart of the electronic impedance tuner at a frequency of 1.8 GHz of the invention, FIG. 5D is a diagram of actually-tested impedance distribution in the Smith chart of the electronic impedance tuner at a frequency of 2.1 GHz of the invention, and FIG. 5E is a diagram of actually-tested impedance distribution in the Smith chart of the electronic impedance tuner at a frequency of 2.4 GHz of the invention. Solid circles in FIGS. 5A-5E are constant reflection coefficient circles under a reflection coefficient of 0.875. It can be seen by analyzing FIGS. 5A-5E, the maximum reflection coefficient of the electronic impedance tuner at all frequencies within the operating frequency range of 0.8-2.5 GHz is over 0.875, and thus, the electronic impedance tuner has a high coverage rate.

What is claimed is:

1. An electronic impedance tuner, comprising an adjusting circuit, N cell tuning circuits identical in structure and a switch controller,
wherein N is an integer greater than or equal to 2, the adjusting circuit has an input terminal, an output terminal and a control terminal, each said cell tuning circuit has an input terminal, an output terminal and a control terminal, the switch controller has N+1 output terminals and is used for controlling on/off of the adjusting circuit and the N cell tuning circuits, the output terminal of the adjusting circuit is connected to the input terminal of the first cell tuning circuit, the output terminal of the $j^{th}$ cell tuning circuit is connected to the input terminal of the $(j+1)^{th}$ cell tuning circuit, j=1, 2, . . . , and N−1, and the N+1 output terminals of the switch controller are connected to the control terminal of the adjusting circuit and the control terminals of the cell tuning circuits in a one-to-one correspondence manner;
the adjusting circuit comprises a first microstrip line, a second microstrip line, a first capacitor, a second capacitor, a third capacitor, a first inductor, a second inductor and a first PIN diode; the first microstrip line has a terminal used as the input terminal of the adjusting circuit and a terminal connected to a terminal of the first capacitor and a terminal of the second capacitor, the first capacitor has a terminal connected to a negative electrode of the first PIN diode and a terminal of the second microstrip line, the second microstrip line has a terminal used as the output terminal of the adjusting circuit, the second capacitor has a terminal connected to a terminal of the first inductor and a positive electrode of the first PIN diode, the first inductor has a terminal connected to a terminal of the third capacitor, a corresponding connecting terminal is the control terminal of the adjusting circuit, another terminal of the third capacitor is grounded, and the second microstrip line is grounded via the second inductor;

each said cell tuning circuit comprises a third microstrip line, a fourth microstrip line, a fourth capacitor, a fifth capacitor, a second PIN diode and a third inductor, wherein the third microstrip line has a terminal used as the input terminal of the cell tuning circuit and a terminal connected to a terminal of the fourth capacitor and a terminal of the fourth microstrip line, the fourth microstrip line has a terminal used as the output terminal of the cell tuning circuit, the fourth capacitor has a terminal connected to a positive electrode of the second PIN diode and a terminal of the third inductor, a negative electrode of the second PIN diode is grounded, the third inductor has a terminal connected to a terminal of the fifth capacitor, a corresponding connecting terminal is the control terminal of the cell tuning circuit, and another terminal of the fifth capacitor is grounded; a capacitance the fourth capacitor is marked as $C_d$ and meets the condition:

$$\frac{4Y_s}{N\pi f_2} \frac{|\Gamma_{req}|}{\sqrt{1-|\Gamma_{req}|^2}} \leq C_d \leq \frac{Y_s}{\pi f_1} \frac{|\Gamma_{req}|}{\sqrt{1-|\Gamma_{req}|^2}},$$

wherein $Y_s$ is a source admittance, $f_1$ is a lower limit of a design operating frequency range, $f_2$ is an upper limit of the design operating frequency, $\Gamma_{req}$ is a maximum design reflection coefficient, $\|$ is an absolute value symbol, and $\pi$ is a symbol of Pi; a length of the third microstrip line is equal to that of the fourth microstrip line, an impedance of the third microstrip line is equal to that of the fourth microstrip line, and the length of the third microstrip line is marked as d and meets the condition:

$$\lambda_1/4(N+1) < d < \frac{c}{4\sqrt{\varepsilon_{reff}}} \left[ \sqrt{(C_d \cdot Z_0)^2 + \left(\frac{2}{\pi f_{Bragg}}\right)^2} - C_d \cdot Z_0 \right],$$

wherein c refers to a light speed and has a value of $2.998 \times 10^8$ m/s, $f_{Bragg}$ refers to a Bragg cut-off frequency and has a value ranging from 1.2 $f_2$ to 1.7 $f_2$, $\varepsilon_{reff}$ is an effective dielectric constant of the third microstrip line, $Z_0$ is the impedance of the third microstrip line and has a value ranging from 70Ω to 110Ω, $\lambda_1$ is a wavelength corresponding to the lower limit $f_1$ of the design operating frequency range, and the first microstrip line and the second microstrip line both have an impedance of 50Ω.

2. The electronic impedance tuner according to claim 1, wherein the first inductor has an impedance marked as $L_{bias1}$, the second inductor has an impedance marked as $L_{bias2}$, and the third inductor has an impedance marked as $L_{bias3}$, wherein 1000Ω<$2\pi f_1 L_{bias1}$<3000Ω, 1000Ω<$2\pi f_1 L_{bias2}$<3000Ω, and 1000Ω<$2\pi f_1 L_{bias3}$<3000Ω; the first capacitor has a capacitance marked as $C_{a1}$, wherein 200Ω<$1/(2\pi f_1 C_{a1})$<400Ω; the second capacitor has a capacitance marked as $C_{a2}$, wherein 3Ω<$1/(2\pi f_1 C_{a2})$<10Ω; the third capacitor and the fifth capacitor both have a capacitance of 0.01 pF; and $Y_s$ has a value of 0.02.

* * * * *